United States Patent [19]

McClure

[11] Patent Number: 5,590,307
[45] Date of Patent: Dec. 31, 1996

[54] DUAL-PORT DATA CACHE MEMORY

[75] Inventor: David C. McClure, Carrollton, Tex.

[73] Assignee: SGS-Thomson Microelectronics, Inc., Carrollton, Tex.

[21] Appl. No.: 711

[22] Filed: Jan. 5, 1993

[51] Int. Cl.$^6$ .................................................. G06F 12/08
[52] U.S. Cl. ......................... 395/458; 395/403; 395/445; 395/421.01; 395/421.08; 395/421.09; 365/230.05
[58] Field of Search ..................................... 395/400, 425, 395/403, 440, 445, 444, 458, 421.01, 421.08, 421.09; 364/200 MS File, 900 MS File; 365/230.05

[56] References Cited

U.S. PATENT DOCUMENTS

| | | | |
|---|---|---|---|
| 4,493,033 | 1/1985 | Ziegler et al. | 395/425 |
| 4,633,441 | 12/1986 | Ishimoto | 365/189 |
| 4,816,997 | 3/1989 | Scales, III et al. | 395/325 |
| 4,825,411 | 4/1989 | Hamano | 365/189 |
| 5,257,236 | 10/1993 | Sharp | 365/230.05 |
| 5,261,064 | 11/1993 | Wyland | 395/400 |
| 5,319,768 | 6/1974 | Rastegar | 395/425 |

FOREIGN PATENT DOCUMENTS

| | | |
|---|---|---|
| 0262413 | 8/1987 | European Pat. Off. . |
| 1145746 | 7/1989 | Japan . |
| WO92/22035 | 12/1992 | WIPO . |

Primary Examiner—Eddie P. Chan
Assistant Examiner—Hiep T. Nguyen
Attorney, Agent, or Firm—Theodore E. Galanthay; Kenneth C. Hill; Lisa K. Jorgenson

[57] ABSTRACT

A dual-port data cache is provided having one port dedicated to servicing a local processor and a second port dedicated to servicing a system. The dual-port data cache is also capable of a high speed transfer of a line or lines of entries by placing the dual-port data cache in "burst mode." Burst mode may be utilized with either a read or a write operation. An initial address is latched internally, and a word line in the memory array is activated during the entire data transfer. A control circuit is utilized to cycle through and access a number of column addresses without having to provide a separate address for each operation.

4 Claims, 2 Drawing Sheets

DUAL-PORT DATA CACHE MEMORY

BACKGROUND OF THE INVENTION

1. Field of the Invention

The present invention relates in general to computer systems, and more particularly to cache memory systems. Still more particularly, the present invention relates to data cache memory arrays.

2. Description of the Prior Art

Cache memories are used in many computer systems to improve system performance. A cache memory is a relatively small, fast memory which resides between a central processor and main system memory. Whenever the processor reads the contents of a memory location which is stored in the cache memory, the time required to access such location is drastically reduced. A good cache technique can provide a "hit ratio" of well over ninety percent, meaning that no main memory access is necessary for over ninety percent of the read operations performed. Access of data which is stored in the cache memory can improve access times by factors of three to ten times.

A cache performs functions requiring two different types of memory. The first type is the tag memory, or tag RAM, which is used to determine which memory locations are actually stored in the cache memory. The second type of memory is the data cache memory, in which the data is actually stored. In general, the cache tag RAM contains a plurality of entries corresponding to the entries of the data cache. Each entry is indexed by some number of least significant bits of the address generated by the central processor, with the tag entry itself containing the most significant bits of the memory location which is stored in the corresponding data cache entry. If the most significant bits stored in the tag RAM match the most significant bits of the address currently being generated, with the least significant bits of this address acting as an index to the tag RAM, a cache "hit" has occurred and the data to be read may be taken from the corresponding data cache entry. If data corresponding to the desired address is not located in the data cache memory, the tag entry will not match the most significant bits of the address, and a "miss" occurs. This indicates that the data must be retrieved from main system memory and placed into the data cache memory.

When transferring data from a data cache memory and main memory, a cache controller must communicate an address to main memory for each transfer. The cache controller communicates with the main memory over the system bus. At the time when the cache controller needs to communicate with main memory, the system bus may be controlled by other devices. Thus, the cache controller is required to wait until the system bus is available before it can communicate with main memory. This bus contention problem may occur each time the cache controller needs to communicate with the main memory. Due to bus contention, the time required to access memory locations in main memory may be drastically increased.

Furthermore, in multi-processor systems, it is possible to provide each processor in a system with its own cache memory. Each local processor accesses its own cache whenever possible, and accesses main memory through a system bus only when necessary. This situation introduces an important problem known as the "cache coherency problem." The cache coherency problem arises when a single memory location is cached in two or more local caches. If one of the processors writes a new value into that memory location, it will be inconsistent with the value of the same variable, or main memory location, currently cached in the other caches. The cache coherency problem also arises when a non-caching device writes to a location in main memory which has been cached by another device.

As known in the art, some systems maintain cache coherency. For some of the methods used to maintain cache coherency, it is necessary to introduce "wait" states when data in the data cache is accessed sequentially by either the local processor or main memory. Wait states are necessary to ensure a sufficient amount of time exists to maintain cache coherency.

An alternative to wait states is to utilize two data cache memories, one for the local processor and one for main memory. Using two data cache memories, however, results in an area penalty, since an extra memory array is required.

Therefore, it would be desirable to provide a method and system for improved transferring of data to or from a cache memory.

SUMMARY OF THE INVENTION

A dual-port data cache is provided having one port dedicated to servicing a local processor and a second port dedicated to servicing a system. The dual-port data cache is also capable of a high speed transfer of a line or lines of entries by placing the dual-port data cache in "burst mode." Burst mode may be utilized with either a read or a write operation. An initial address is latched internally, and a word line in the memory array is activated during the entire data transfer. A control circuit is utilized to cycle through and access a number of column addresses without having to provide a separate address for each operation.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
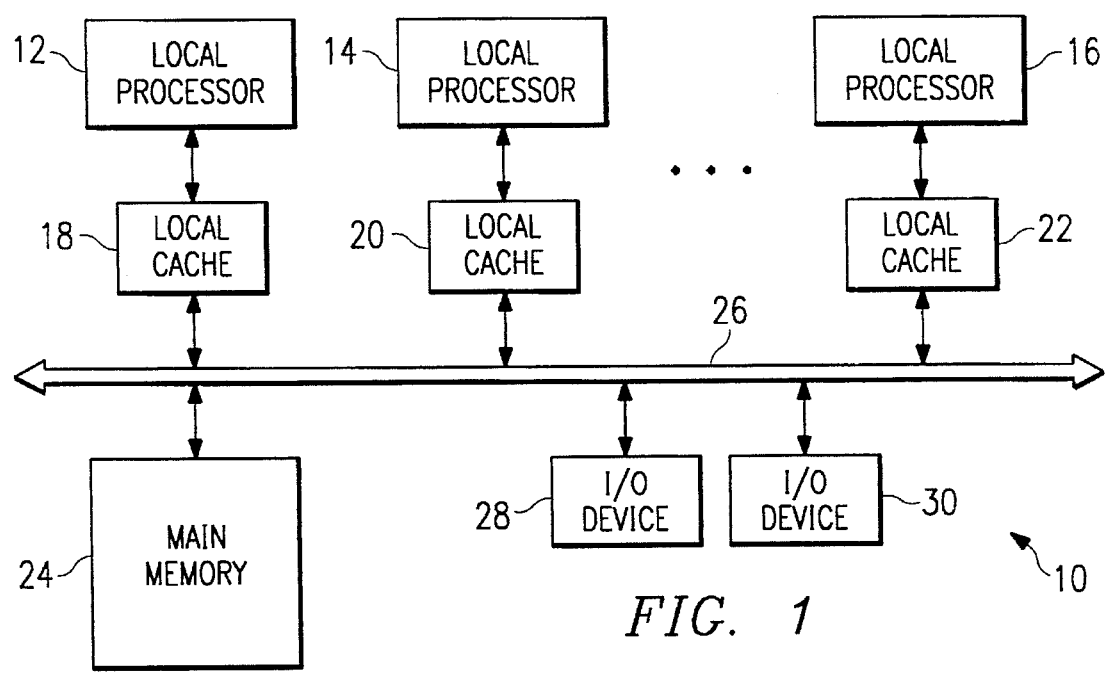
FIG. 1 is a high level block diagram of a multiprocessor computer system.

Referring to FIG. 1, a multi-processor computer system is illustrated and referred to generally with the reference number 10. Local processors 12, 14, 16 are each provided with a local cache memory 18, 20, 22. The processors 12, 14, 16 communicate with each other and with a main system memory 24 through a system bus 26. A plurality of input/output devices 28, 30 are also attached to the system bus 26. Input/output devices 28, 30 typically do not contain local cache memories.

Figure 2:
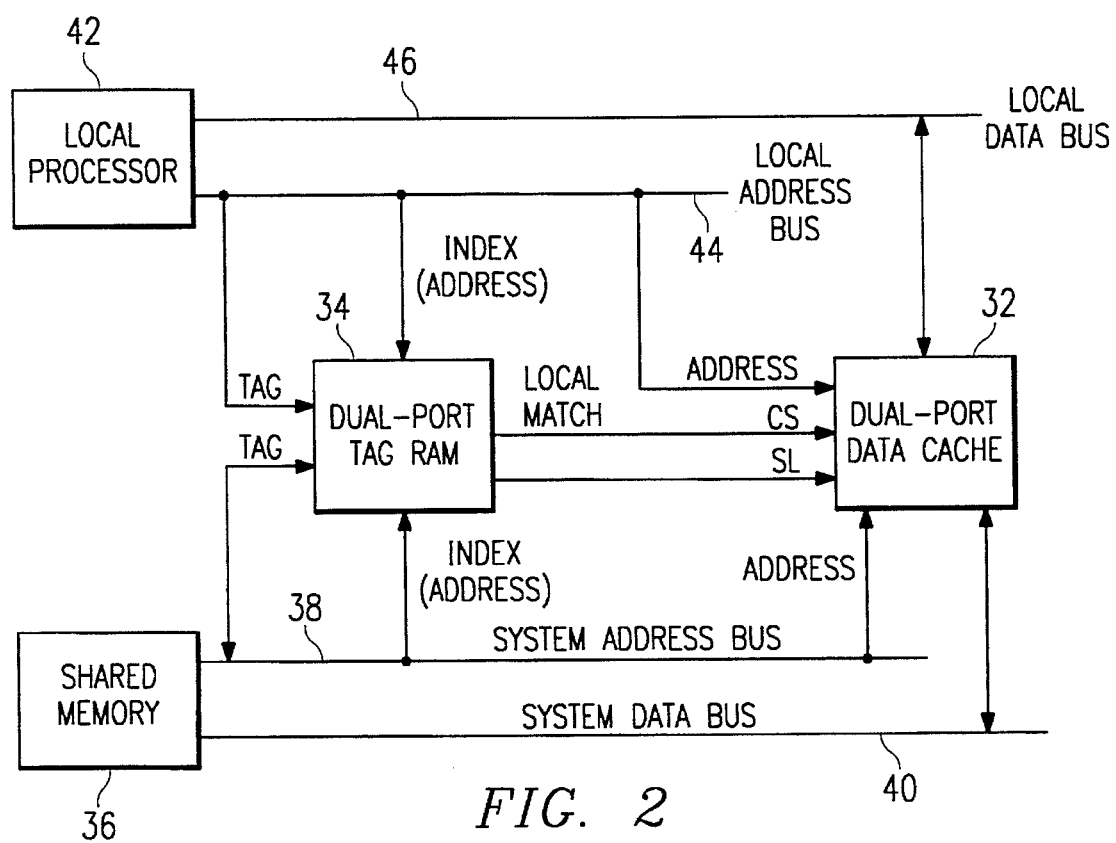
FIG. 2 is a high level block diagram illustrating a data cache memory in a cache memory system according to the present invention.

FIG. 2 is a high level block diagram illustrating a data cache memory in a cache memory system according to the present invention. A dual-port data cache 32 and a dual-port cache tag RAM 34 communicate with a shared, or main memory 36 through a system address bus 38 and a system data bus 40. Dual-port data cache 32 and dual-port cache tag RAM 34 also communicate with a local processor 42 through a local address bus 44 and a local data bus 46. Thus, one port of data cache 32 and cache tag RAM 34 is dedicated to servicing local processor 42, while the second port of data cache 32 and cache tag RAM 34 is dedicated to servicing shared memory 36.

Address and control signals are communicated from local processor 42 to cache tag RAM 34. Address and control signals are also communicated between cache tag RAM 34 and shared memory 36. In general, cache tag RAM 34 contains a plurality of entries corresponding to the entries in data cache 32. Each entry is indexed by some number of least significant bits of the address generated by a central processor, with the tag entry itself containing the most significant bits of the memory location which is stored in the corresponding entry in data cache 32. If the most significant bits stored in cache tag RAM 34 match the most significant bits of the address currently being generated, with the least significant bits of this address acting as an index to cache tag RAM 34, a cache "hit" has occurred and the data to be read may be taken from the corresponding entry in data cache 32. If data corresponding to the desired address is not located in data cache 32, the tag entry will not match the most significant bits of the address, and a "miss" occurs. A miss indicates that the data must be retrieved from main system memory and placed into data cache 32. Data cache 32 exchanges data with the local processor 42 and shared memory 36 typically under the control of a cache controller (not shown).

Tag RAM 34 passes a signal MATCH to data cache 32, or to the cache controller to indicate that the memory location currently being addressed by local processor 42 resides in data cache 32, and that the entry is currently valid. The location being accessed by local processor 42 is then read directly from data cache 32. If MATCH indicates a miss, the contents of the address location are accessed from shared memory 36 over system data bus 40.

Figure 3:
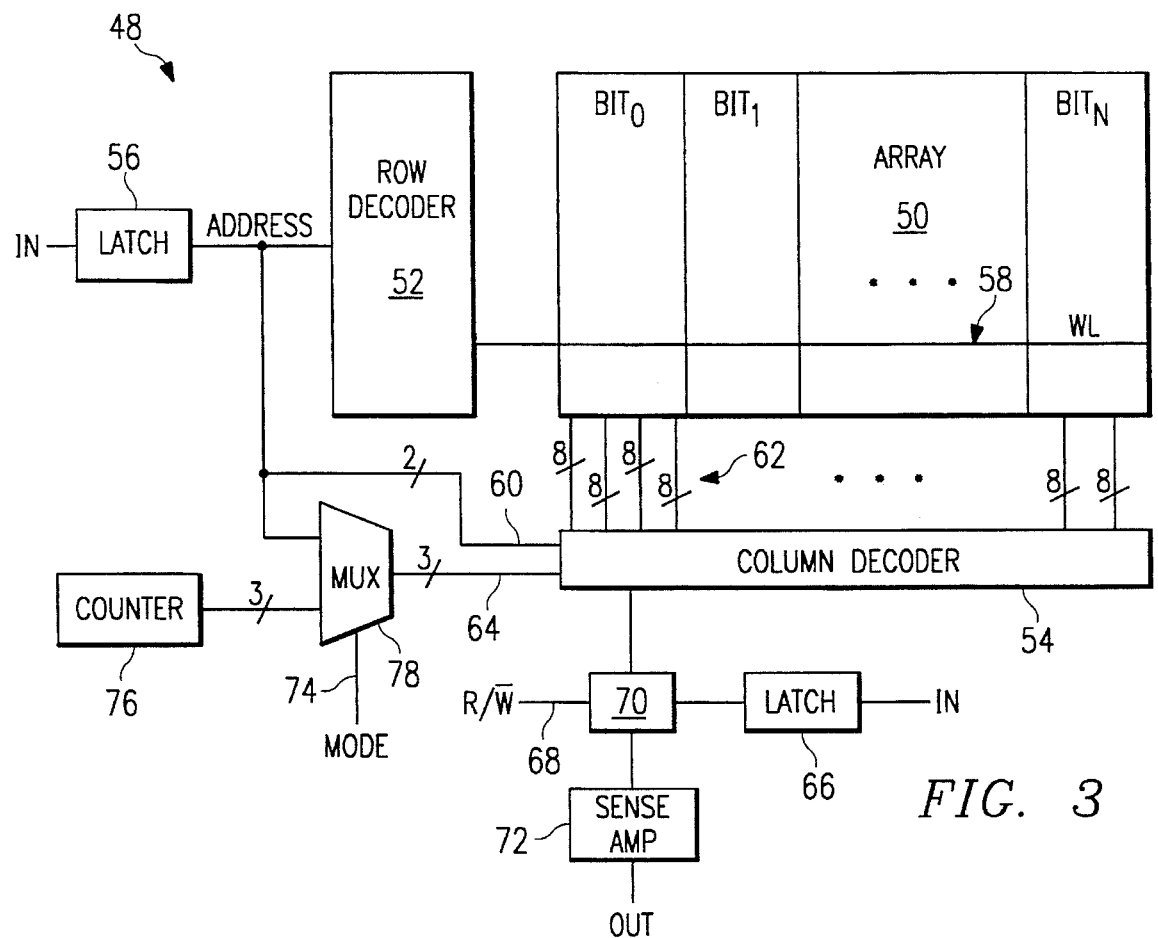
FIG. 3 is a high level block diagram illustrating a portion of a data cache memory according to the present invention.

Referring to FIG. 3, a high level block diagram illustrates a portion of a dual-port data cache memory according to the present invention. FIG. 3 depicts only a portion of one port in the dual-port data cache memory, preferably the system port. Dual-port data cache 48 includes a memory array 50, a row decoder 52, and a column decoder 54. To read or write data into memory array 50, an address is input into latch 56 and is passed to row decoder 52. A portion of the address is also input into the column decoder 54.

In the example depicted in FIG. 3, 5 bit positions of the address are input into column decoder 54. Two of the bits, located on line 60, are used to select one of the four line groups 62 per bit position. Three of the bits, located on line 64, are used to select a particular bit within the 8 bit group. The column decoder 54 uses the 5 bits from the address to select a particular bit line in preparation for a read or write operation. If the operation is a write operation, data is input into latch 66. A read/write enable signal 68 enables the switch 70 to input the data into column decoder 54, which writes the data into memory array 50. If the operation is a read operation, the read/write signal 68 enables the data to pass through switch 70 to be read by a sense amplifier 72.

A separate read/write circuit containing latch 66, read/write enable signal 68, switch 70, and sense amplifier 72 exists for each bit position in memory array 50. Only one read/write circuit is illustrated in FIG. 3.

In general, word transfers occur between a local processor and a cache memory, and line transfers occur between the cache memory and a shared memory. As an example, a word is composed of 32 bits, and a line contains 8 words. Because line transfers usually occur between the cache memory and the shared memory, a "burst mode" is preferably supplied for the system side of data cache 48. "Burst mode" is a method of quickly transferring a line or lines of data. In burst mode, a number of addresses for data are transferred without having to present a new address for each read or write operation. In the preferred embodiment, data cache 48 is placed in burst mode for either a read or write operation by a mode signal on line 74. An initial address is latched in latch 56, and row decoder 52 activates a word line 58 within memory array 50 in response to receiving an address. Counter 76 and multiplexer 78 are then used to sequence through a number of addresses, causing the data located at the addresses to be accessed without having to wait for each address to be provided through latch 56. In some systems, a portion of the initial address may have to be loaded into counter 76 to establish a starting point for sequencing.

When not in burst mode, data stored in memory array 50 is accessed by passing a portion of an address through multiplexer 78, across line 64 and into column decoder 54.

Figure 4:
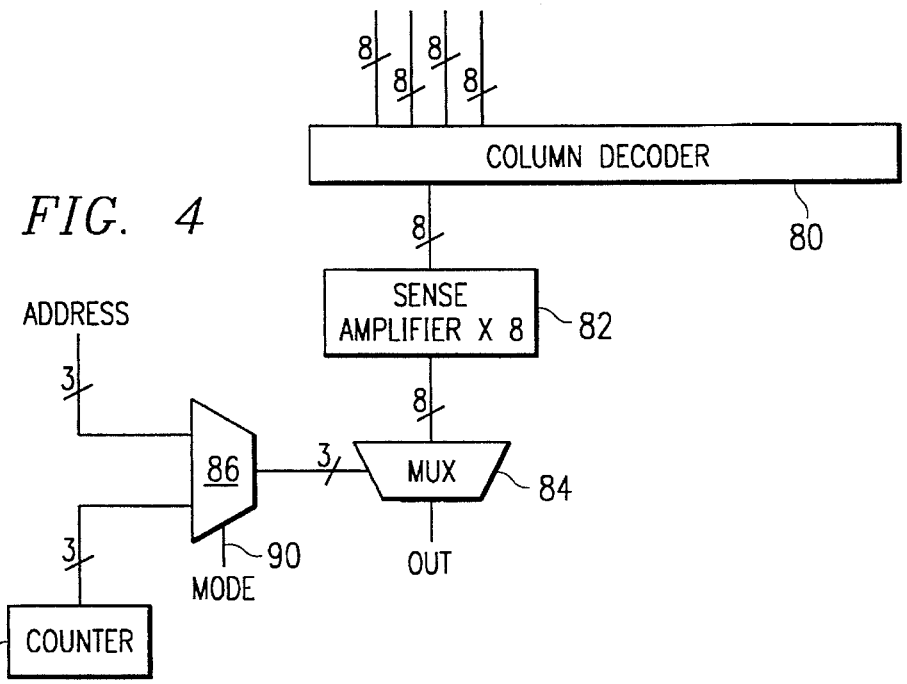
FIG. 4 is a high level block diagram illustrating a portion of an alternative data cache memory according to the present invention.

FIG. 4 is a high level block diagram illustrating a portion of an alternative dual-port data cache memory according to the present invention. FIG. 4 depicts only a portion of one port of the dual-port data cache memory, and includes a column decoder 80, a block 82 illustrating 8 sense amplifiers connected to column decoder 80, a multiplexer 84 connected to block 82, a multiplexer 86 connected to multiplexer 84, and a counter 88 connected to multiplexer 86. This portion of a data cache is utilized to place the data cache in burst mode for read operations only, and is preferably supplied only for the system port. A mode signal is set on line 90 to place the data cache in burst mode, and a portion of an address is input into multiplexer 86. Counter 88 and multiplexer 86 are then used to sequence through a number of addresses. In some systems, a portion of the initial address may have to be loaded into counter 88 to establish a starting point for sequencing.

In the preferred embodiment, a single burst mode circuit, containing counter 88 and multiplexer 86, is required for the data cache memory, while block 82 and multiplexer 84 are required for each bit position within the memory array. When not in burst mode, data stored in the memory array is accessed by passing a portion of an address through multiplexer 86 where multiplexer 86 selects one line from the line groups.

Although the dual-port data cache of the present invention has been described with the burst mode provided to the system side, it is also possible to supply a high speed burst mode to the local side. To perform write operations, latches or registers may be used to furnish the data to the memory array. Alternatively, shift registers may be used to shift the data into the memory array.

The dual-port data cache of the present invention may be utilized in computer systems which implement cache coherency policies. As known in the art, maintaining cache coherency is mandatory where a shared memory and cache memories operate within one system. One cache coherency policy is MOESI, which allows for five states which define the quality of data within the cache memory. These states are modified, owned, exclusive, shared and invalid.

In a multi-cache, multi-processing system utilizing the preferred data cache memory, it is advantageous to have each cache memory monitor a private bus to the processor and a shared bus to the shared memory and other cache memories, and update itself, the shared memory or other cache memories when necessary. Access intervention and access reflection are two techniques which may be implemented in a cache system which utilizes the preferred data cache memory. Access intervention occurs when a cache memory intervenes for the shared memory when the cache memory contains data which is "dirty". Dirty data is data which has been updated in the cache memory but not in the shared memory. When a second cache memory requests the data from shared memory, the cache memory which has updated the data intervenes for the shared memory and provides the updated data to the second cache memory. Access reflection occurs when the shared memory updates its data during an access intervention operation.

During writes to a cache memory, the write may be broadcast over the system bus and all other cache memories holding the same data will "listen in" on the transaction and update themselves. This is called "snarfing." Snarfing is a technique which may be implemented in a system using the preferred data cache memory to maintain cache coherency. Finally, another cache coherency technique which may be used in a system using the preferred data cache memory is transaction abortion. Transaction abortion allows a cache memory holding updated data to abort bus transactions accessing the updated data until the cache memory gains control of the bus and writes the updated data to the shared memory.

Those skilled in the art will appreciate that Applicant has provided a dual-port data cache memory having one port dedicated to servicing a local processor and the second port dedicated to servicing the system. This data cache architecture allows updating on the system side to occur in parallel with data accesses on the local side. Additionally, the preferred data cache memory may be utilized with a variety of cache coherency techniques or policies. Furthermore, the dual-port data cache has the ability to be placed in burst mode, allowing blocks of data at consecutive address locations to be transferred when only an initial address is presented. This technique enables the transferring of data to occur at a high rate of speed.

While the invention has been particularly shown and described with reference to a preferred embodiment, it will be understood by those skilled in the art that various changes in form and detail may be made therein without departing from the spirit and scope of the invention.

What is claimed is:

1. A dual-port data cache memory, comprising:

a dual-port memory array having a plurality of entries, wherein each of said plurality of entries has a corresponding address, said memory array laid out as a plurality of rows and columns, wherein a plurality of memory cells in a row are selected for reading or writing by activating a single word line, and wherein the plurality of selected cells place data onto a corresponding plurality of bit lines;

a first memory port capable of reading and writing entries to the dual-port memory array, wherein the first memory port is utilized by a processor;

a second memory port capable of reading and writing entries to the dual-port memory array, wherein the second memory port is utilized by a system;

an address latch connected to the second memory port for storing an address generated by the system on an address bus;

a row decoder for decoding a plurality of most significant bits from the address latch, and activating a word line;

a column decoder connected to the plurality of bit lines for selecting a subset thereof, wherein at least one less significant bit than the most significant bits from the address latch are connected to the column decoder, and wherein the subset of bit lines is selected in response to such less significant bits;

a counter for generating a sequence of consecutive binary signals representing numbers; and means for connecting the binary signals generated by the counter to the column decoder in response to a control signal;

wherein, in response to the control signal, a plurality of entries selected by the column decoder in response to the signals generated by the counter are read from the memory array for a single address stored in the address latch.

2. The memory of claim 1, wherein the means for connecting the binary signals comprises:

a multiplexer having a selected number of first inputs connected to the signals generated by the counter, and having a corresponding number of second inputs connected to least significant bits of the address latch; and a control input for the multiplexer connected to the control signal, wherein the first inputs are connected to the column decoder when the control signal has a first state, and the second inputs are connected to the column decoder when the control signal has a second state.

3. A dual-port data cache memory, comprising:

a dual-port memory array having a plurality of entries, wherein each of said plurality of entries has a corresponding address, said memory array laid out as a plurality of rows and columns, wherein a plurality of memory cells in a row are selected for reading or writing by activating a single word line, and wherein the plurality of selected cells place data onto a corresponding plurality of bit lines;

a first memory port capable of reading and writing entries to said dual-port memory array, wherein said first memory port is utilized by a processor;

a second memory port capable of reading and writing entries to said dual-port memory array, wherein said second memory port is utilized by a system;

an address latch connected to the second memory port for storing an address generated by the system on an address bus;

a row decoder for decoding a plurality of most significant bits from the address latch, and activating a word line;

a column decoder connected to the plurality of bit lines for selecting a subset thereof, wherein at least one less significant bit than the most significant bits from the address latch are connected to the column decoder, and wherein the subset of bit lines is selected in response to such less significant bits;

a counter for generating a sequence of consecutive binary signals representing numbers;

a plurality of sense amplifiers connected to the column decoder for sensing data on bits lines selected thereby; and means for sequentially selecting entries from the memory array in response to a control signal, wherein the selected entries are designated using the signals generated by the counter;

wherein, in response to the control signal, a plurality of entries selected by the column decoder in response to the signals generated by the counter are read from the memory array for a single address stored in the address latch.

4. The memory of claim 3, wherein the means for sequentially selecting entries comprises:

a first multiplexer having a plurality of sets of inputs corresponding to sets of bit lines selected by the column decoder, wherein one of the sets is selected to be output in response to input control signals presented at a control input thereof;

a second multiplexer having a selected number of first inputs connected to the signals generated by the counter, and having a corresponding number of second inputs connected to least significant bits of the address latch; and a control input for the multiplexer connected to the control signal, wherein the first inputs are connected to the first multiplexer control inputs when the control signal has a first state, and the second inputs are connected to the first multiplexer control inputs when the control signal has a second state.

\* \* \* \* \*